(12) United States Patent
Kong et al.

(10) Patent No.: US 11,122,716 B2
(45) Date of Patent: Sep. 14, 2021

(54) DISPLAY DEVICE

(71) Applicant: LG Display Co., Ltd., Seoul (KR)

(72) Inventors: Jinyoung Kong, Paju-si (KR); Taekjung Kwon, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 89 days.

(21) Appl. No.: 16/717,100

(22) Filed: Dec. 17, 2019

(65) Prior Publication Data

US 2020/0205320 A1   Jun. 25, 2020

(30) Foreign Application Priority Data

Dec. 19, 2018   (KR) .................. 10-2018-0165225

(51) Int. Cl.
| | | |
|---|---|---|
| H05K 7/20 | (2006.01) | |
| H05K 5/03 | (2006.01) | |
| H05K 1/18 | (2006.01) | |
| G02F 1/1333 | (2006.01) | |

(52) U.S. Cl.
CPC ... *H05K 7/20972* (2013.01); *G02F 1/133385* (2013.01); *H05K 1/189* (2013.01); *H05K 5/03* (2013.01); *H05K 7/20963* (2013.01); *H05K 2201/10128* (2013.01)

(58) Field of Classification Search
CPC . H05K 7/20963–20972; H05K 7/2039; H05K 7/20436–20445; H05K 1/189; H05K 5/03; H05K 2201/10128; H01L 51/529; G06F 1/1601; G06F 1/1613; G06F 1/20–203; G02F 1/133308–13332
See application file for complete search history.

(56) References Cited

U.S. PATENT DOCUMENTS

| | | | | |
|---|---|---|---|---|
| 7,369,407 B2 * | 5/2008 | Kim | ................... | H05K 7/20972 361/695 |
| 2005/0279116 A1 * | 12/2005 | Park | ........................ | F24F 13/28 62/317 |
| 2007/0103863 A1 * | 5/2007 | Kim | ................... | H05K 7/20972 361/679.21 |
| 2007/0103909 A1 * | 5/2007 | Park | ................... | H05K 7/20972 362/294 |
| 2011/0039490 A1 * | 2/2011 | Wiese | ..................... | F24F 7/013 454/200 |
| 2019/0331350 A1 * | 10/2019 | Choi | ........................ | F24F 13/20 |
| 2020/0166226 A1 * | 5/2020 | Oh | ......................... | F24F 5/0042 |

* cited by examiner

*Primary Examiner* — Zachary Pape
*Assistant Examiner* — Amir A Jalali
(74) *Attorney, Agent, or Firm* — Morgan, Lewis & Bockius LLP

(57) ABSTRACT

A display device includes a display panel, a bottom cover at a rear surface of the display panel, and a heat dissipation assembly. The heat dissipation assembly includes a housing between the display panel and the bottom cover, conductive lines on two lateral sides within the housing and configured to supply electricity therethrough, and a movable member having both ends thereof supported by and electrically connected to the conductive lines to thereby be movable in a longitudinal direction of the housing.

20 Claims, 10 Drawing Sheets

DISPLAY DEVICE

CROSS REFERENCE TO RELATED APPLICATION

This application claims priority to Korean Patent Application No. 10-2018-0165225, filed in Korea on Dec. 19, 2018, which is hereby incorporated by reference for all purposes as if fully set forth herein.

BACKGROUND

Technical Field

Example embodiments relate to a display device, and more particularly, to a display device having a low-noise, compact heat dissipation structure able to improve heat dissipation performance, thereby improving the image quality and durability of a display panel.

Discussion of the Related Art

In general, research into flat panel display devices, such as liquid crystal display (LCD) devices, plasma display panel (PDP) devices, field emission display (FED) devices, and organic light-emitting diode (OLED) display devices, has been actively undertaken. Among such flat panel display devices, LCD devices and OLED display devices have recently come to prominence, due to advantages thereof, such as adaptability to mass production, easy implementation of driving units, and the ability thereof to realize high resolution.

However, in such display devices of the related art, heat generated by integrated circuits (ICs) mounted on a circuit film or a printed circuit board (PCB) may degrade the image quality of a display panel, and deteriorate the durability of the display panel and a variety of components.

Recently, research has increasingly been required for the development of a display device able to protect a circuit film, a PCB, or the like, disposed within the display device while improving heat dissipation performance.

SUMMARY

Accordingly, the present disclosure is directed to a display device that substantially obviates one or more of the problems due to limitations and disadvantages of the related art.

An aspect of the present disclosure is to provide a display device able to improve heat dissipation performance of a display panel and built-in components, such as a plurality of circuit films, driving integrated circuits (ICs), and a printed circuit board (PCB), connected to the display panel.

Another aspect of the present disclosure is to provide a display device having a low-noise, compact heat dissipation structure able to improve heat dissipation performance, thereby improving the image quality and durability of a display panel.

Additional features and advantages of the disclosure will be set forth in the description which follows, and in part will be apparent from the description, or may be learned by practice of the disclosure. The objectives and other advantages of the disclosure will be realized and attained by the structure particularly pointed out in the written description and claims hereof as well as the appended drawings.

To achieve these and other advantages and in accordance with the purpose of the present disclosure, as embodied and broadly described, a display device comprises a display panel; a bottom cover at a rear surface of the display panel; and a heat dissipation assembly including a housing between the display panel and the bottom cover, conductive lines on two lateral sides within the housing and configured to supply electricity therethrough, and a movable member having both ends thereof supported by and electrically connected to the conductive lines to thereby be movable in a longitudinal direction of the housing.

According to example embodiments, the heat dissipation member may improve heat dissipation performance of the display panel and built-in components, such as a plurality of circuit films, driving ICs, and a PCB, connected to the display panel.

According to example embodiments, it may be possible to improve heat dissipation performance of the display panel and the built-in components, such as the plurality of circuit films, the driving ICs, and the PCB, connected to the display panel.

In addition, according to example embodiments, the display device may be provided with a low-noise, compact heat dissipation structure that improves the image quality and durability of the display panel without noise such as from a heat dissipation fan.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principles of the disclosure. In the drawings.

DETAILED DESCRIPTION

Figure 1:
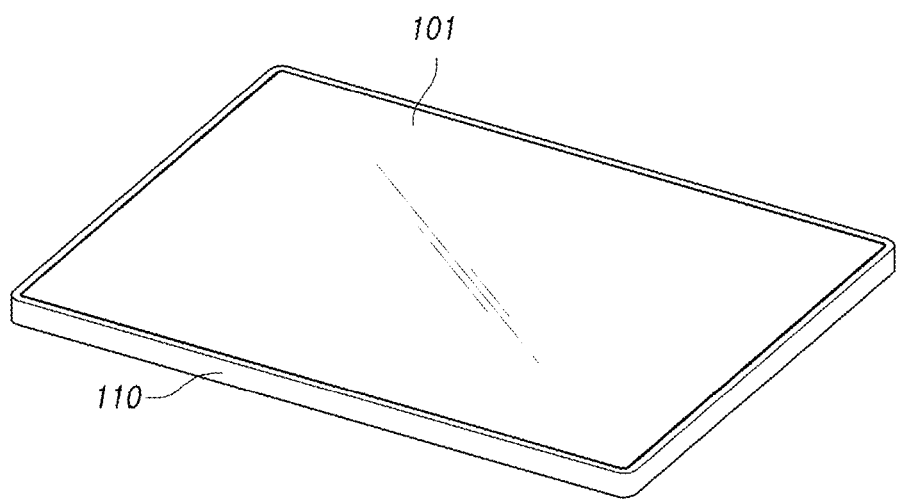
FIG. 1 is a perspective view illustrating a display device according to example embodiments.

Reference will now be made in detail to some embodiments of the present disclosure, examples of which are illustrated in the accompanying drawings.

Throughout this document, reference is made to the drawings, in which the same reference numerals and symbols will be used to designate the same or like components. In the following description of the present disclosure, detailed descriptions of known functions and components incorporated into the present disclosure will be omitted in the case that the subject matter of the present disclosure may be rendered unclear thereby.

It will also be understood that, while terms, such as "first," "second," 'A,' 'B,' '(a),' and '(b),' may be used herein to describe various elements, such terms are merely used to distinguish one element from other elements. The substance, sequence, order, or number of such elements is not limited by these terms. It will be understood that when an element is referred to as being "connected," "coupled," or "linked" to another element, not only can it be "directly connected, coupled, or linked" to the other element, but it can also be "indirectly connected, coupled, or linked" to the other element via an "intervening" element.

Figure 2:
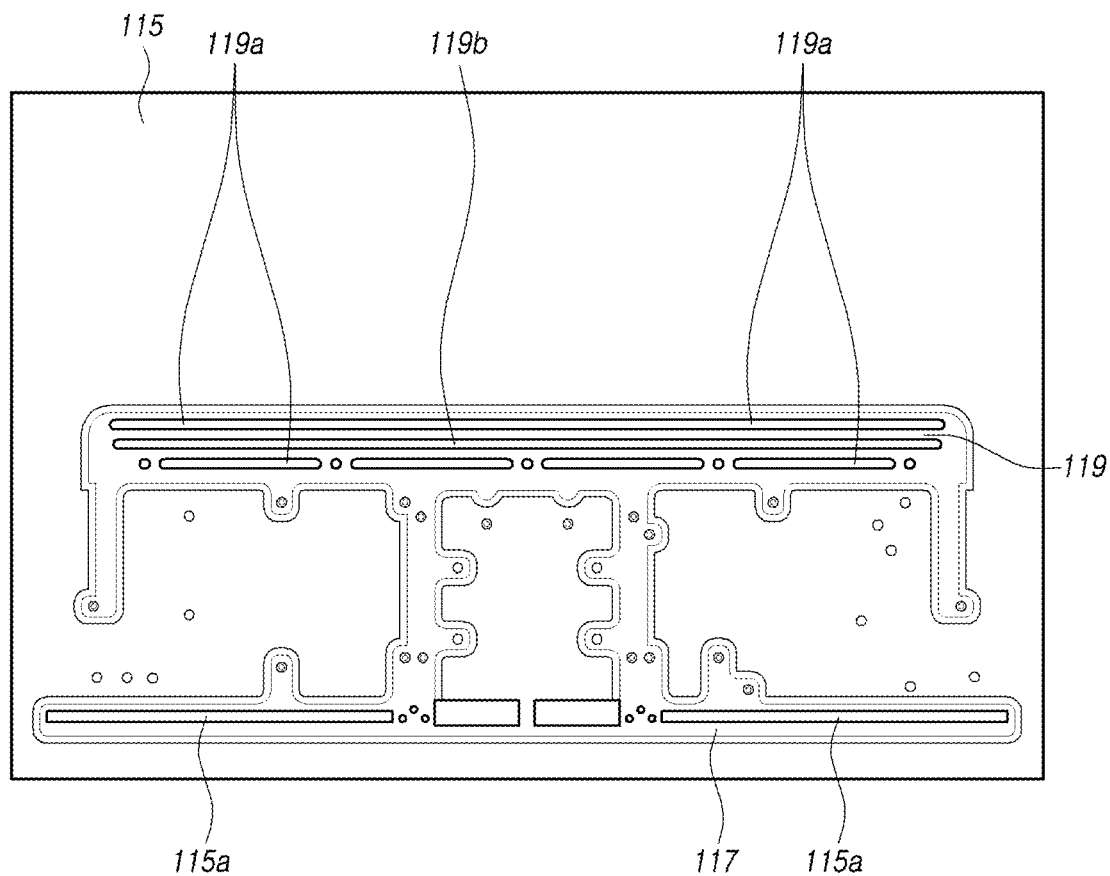
FIG. 2 is a rear view illustrating the display device according to example embodiments.
Figure 3:
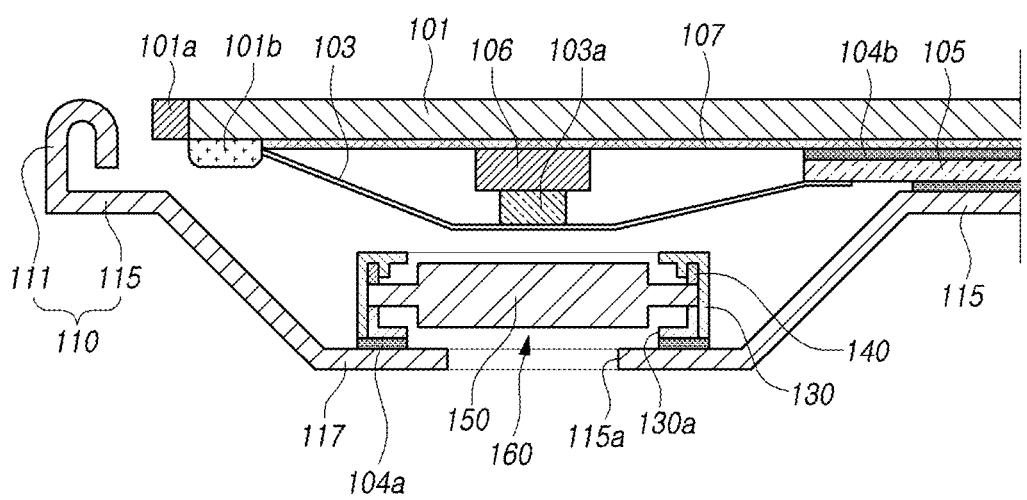
FIGS. 3 and 4 are cross-sectional views illustrating portions of the display device according to example embodiments.
Figure 4:
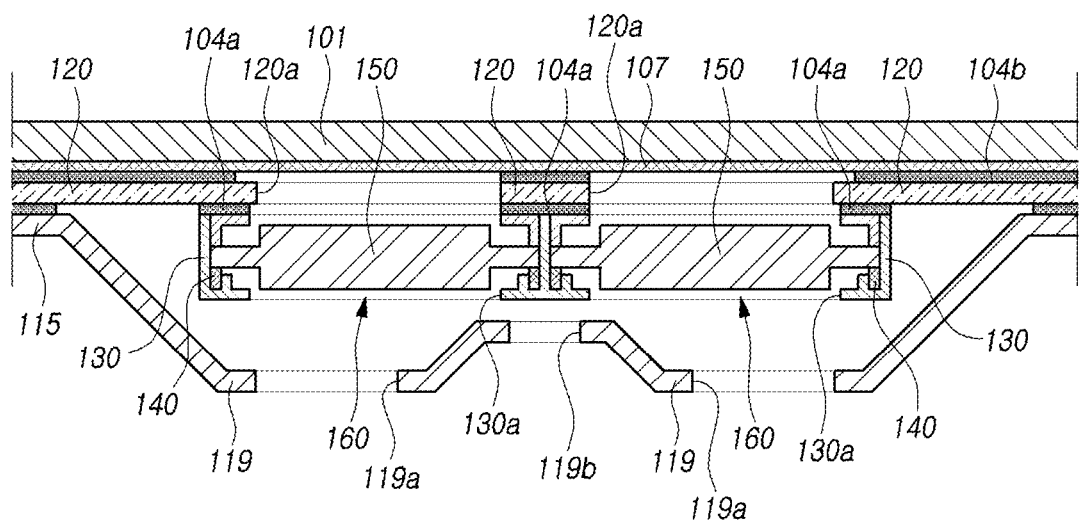
Figure 5:
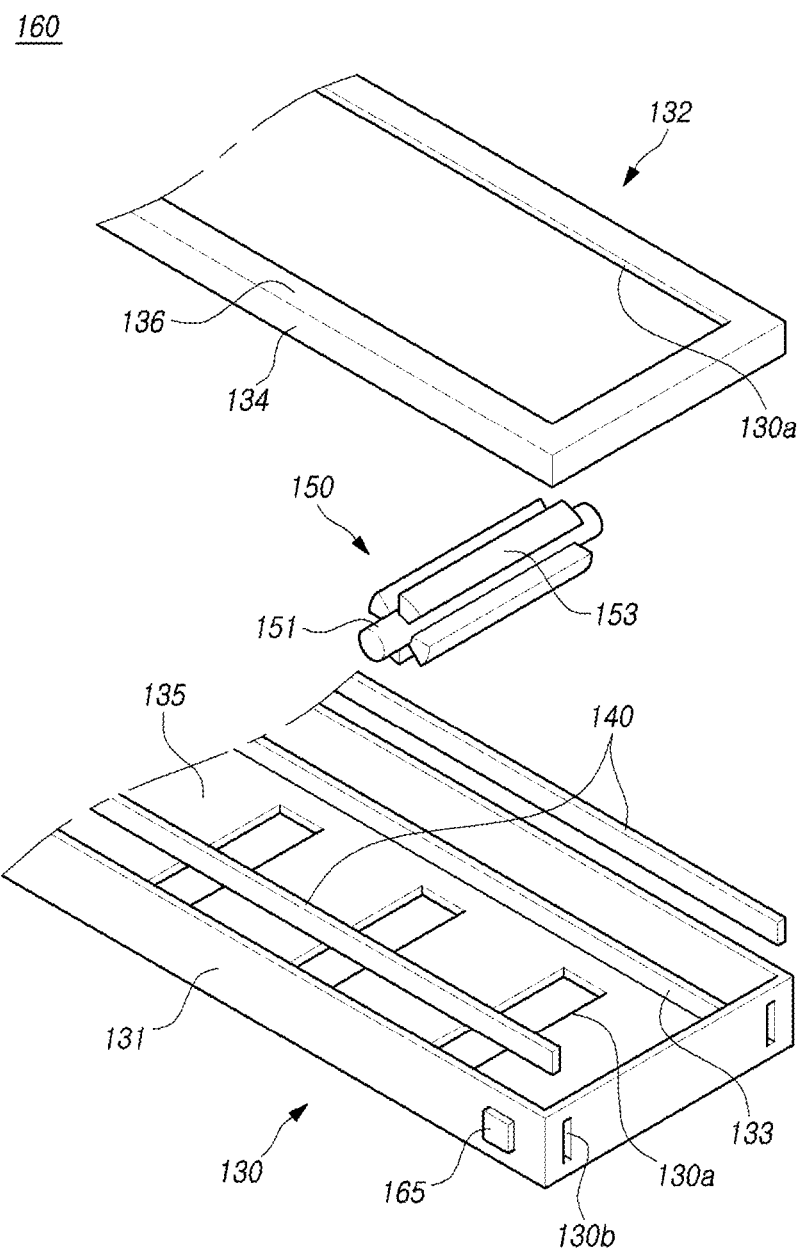
FIG. 5 is a perspective view illustrating portions of the display device according to example embodiments.
Figure 6:
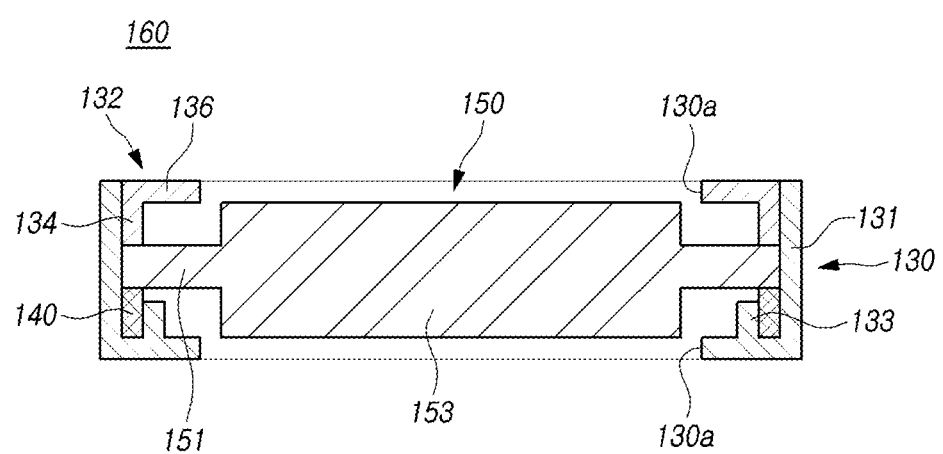
FIG. 6 is a cross-sectional view illustrating a portion of the display device according to example embodiments.
Figure 7:
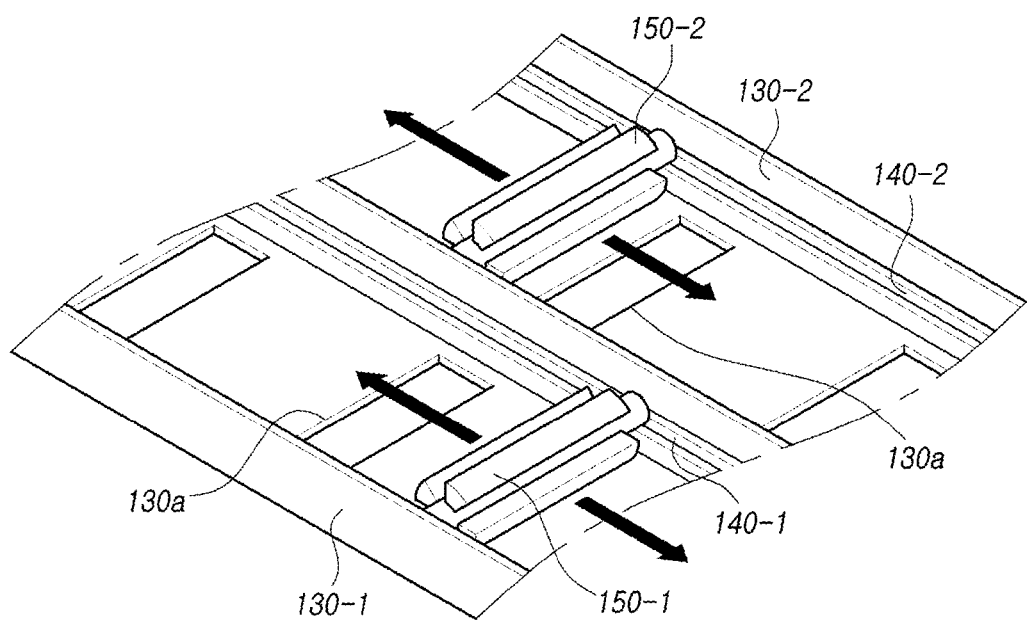
FIG. 7 is perspective view illustrating portions of the display device according to example embodiments.
Figure 8:
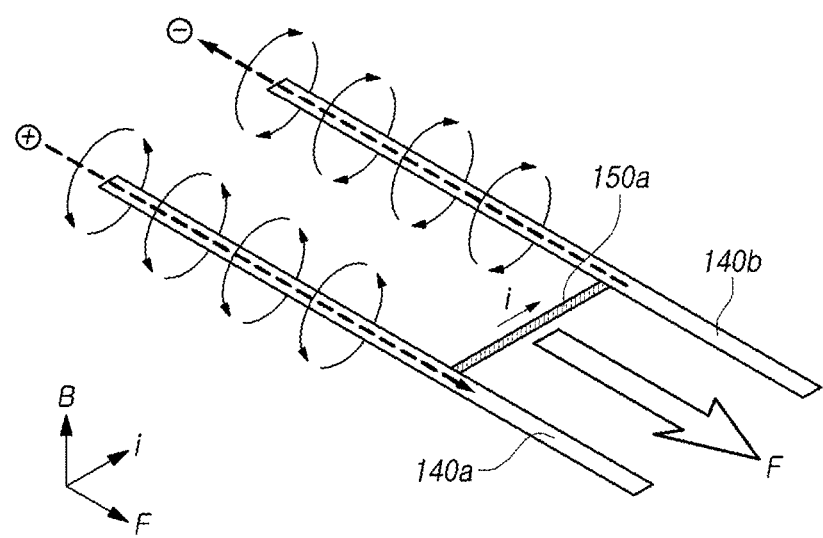
FIG. 8 is a conceptual view illustrating the movement of the movable member in the display device according to example embodiments.
Figure 9:
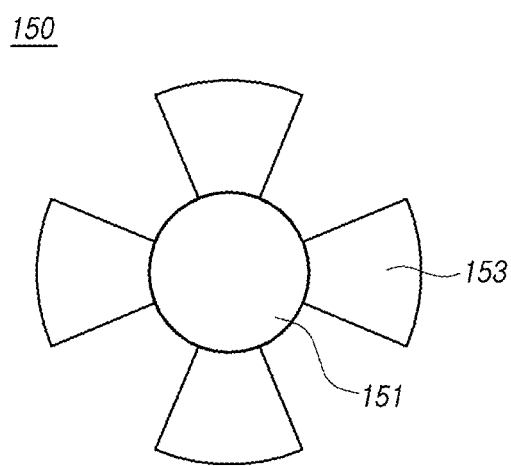
FIGS. 9 and 10 are side views illustrating portions of the display device according to example embodiments.
Figure 10:
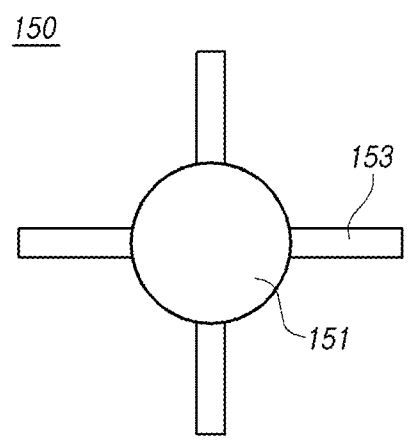

FIG. 1 is a perspective view illustrating a display device according to example embodiments, FIG. 2 is a rear view illustrating the display device according to example embodiments, FIGS. 3 and 4 are cross-sectional views illustrating portions of the display device according to example embodiments, FIG. 5 is a perspective view illustrating portions of the display device according to example embodiments, FIG. 6 is a cross-sectional view illustrating a portion of the display device according to example embodiments, FIG. 7 is a perspective view illustrating portions of the display device according to example embodiments, FIG. 8 is a conceptual view illustrating the movement of the movable member in the display device according to example embodiments, and FIGS. 9 and 10 are side views illustrating portions of the display device according to example embodiments.

As illustrated in FIGS. 1 to 10, a display device 100 according to example embodiments includes a display panel 101, a bottom cover (also referred to as a "cover bottom") 110, and a heat dissipation assembly 160. The bottom cover 110 includes a side support 111 disposed on a side surface of the display panel 101, and a rear support 115 disposed on the rear surface of the display panel 101. The heat dissipation assembly 160 includes a housing 130, conductive lines 140, and a movable member 150.

The housing 130 is located on both sides of the bottom cover 110 in the longitudinal direction, and between the display panel 101 and the bottom cover 110. The conductive lines 140 are disposed on both lateral sides within the housing 130, such that electricity is supplied therethrough. The movable member 150 has both ends supported by and electrically connected to the conductive lines 140 to be reciprocally movable in the longitudinal direction of the housing 130 by electromagnetic force.

First, with reference to FIGS. 1 to 4, the display device 100 according to example embodiments has the heat dissipation assembly 160 disposed between the display panel 101 and the bottom cover 110 to dissipate heat generated by the display panel 101 and other built-in components, such as a plurality of circuit films 103 connected to the display panel 101, driving integrated circuits (IC) 103a mounted on the circuit films 103, and a printed circuit board (PCB) 105.

Example embodiments may be applied regardless of whether the display panel 101 is a liquid crystal display (LCD) panel or a light-emitting display panel (e.g., an organic light-emitting diode (OLED) display panel).

In an example where the display panel 101 is an LCD panel, the display panel 101 may include a backlight unit illuminating the LCD panel, a bottom polarizer attached to a bottom substrate, and a top polarizer attached to a front surface of a top substrate. The specific configuration of each of the bottom substrate and the top substrate may be one of a variety of configurations known in the art, depending on the driving mode of the LCD panel, such as a twisted nematic (TN) mode, a vertical alignment (VA) mode, an in-plane switching mode, and a fringe field switching (FFS) mode.

In an example where the display panel 101 is a light-emitting display panel, the display panel 101 may include a bottom substrate in which a plurality of emission cells are arrayed in areas defined by gate lines, data lines, and power (VDD) lines, respectively, and a top substrate facing and attached to the bottom substrate.

In addition, each of the plurality of emission cells provided in the bottom substrate may include at least one switching transistor connected to a corresponding gate line among the plurality of gate lines and a corresponding data line among the plurality of data lines, at least one driving transistor connected to the switching transistor and a power (VDD) line among the plurality of power lines, and a light-emitting element (e.g. an OLED) emitting light in response to a current controlled by switching of the driving transistor. Also, the top substrate may include a moisture absorbent or the like, to protect the light-emitting elements from moisture or oxygen in the ambient air.

The top substrate may further include light-emitting elements connected to the driving transistors. In this case, the light-emitting elements may be omitted from the bottom substrate.

In the drawings, the light-emitting display panel 101 is illustrated by way of example, and embodiments are not limited thereto. Because the light-emitting display panel 101 has a self-emission structure, a backlight unit illuminating the panel is not illustrated. The following description is provided for an example in which the display panel 101 is a light-emitting display panel.

Because an organic compound contained in a pixel array of the light-emitting display panel 101 may deteriorate when exposed to moisture or oxygen, an encapsulation member 107 may be bonded to the rear surface of the display panel 101 to seal the pixel array to protect against moisture or oxygen and prevent the deterioration of the pixels.

The encapsulation member 107 may be a metal substrate or a glass substrate, and a polarizer film (not shown) may be attached to the front surface of the display panel 101 by adhesion or bonding.

In addition, a side seal member 101a may be provided on the side surface of the display panel 101 to prevent light leakage, where light emitted by the pixel array may otherwise leak through the side surface of the display panel 101.

Here, the side seal member 101a may be made of a polymer material to which a black pigment is added. Thus, the side seal member 101a may absorb light emitted from the pixel array, so that light does not leak through the side surface of the display panel 101.

In addition, the plurality of flexible circuit films 103 are attached to the display panel 101 and the PCB 105 using fixing members 101b, such as a resin, by a tape-automated bonding (TAB) process. The flexible circuit films 103 may be tape carrier packages (TCPs), chip-on-flexible boards, or chip-on-films (COFs).

Accordingly, the display panel 101 is electrically connected or coupled to the PCB 105 via the plurality of flexible circuit films 103. Furthermore, the PCB 105 is electrically connected to the plurality of flexible circuit films 103, through which a variety of signals are provided to the display panel 101 to display images. The driving ICs and the like, which control the operation of the display panel 101, are mounted on the circuit films 103.

In addition, the heat dissipation assembly 160 is provided to dissipate heat generated by the display panel 101, as well as other built-in components, such as the circuit films 103, the driving IC 103a mounted on the circuit films 103, and the PCB 105. In this regard, the heat dissipation assembly 160 includes the housing 130 disposed between the display panel 101 and the bottom cover 110, the conductive lines 140 provided on both lateral sides within the housing 130 such that electricity is supplied therethrough, and the movable member 150 having both ends supported by and electrically connected to the conductive lines 140 so as to be reciprocally movable in the longitudinal direction of the housing 130 by electromagnetic force.

The bottom cover 110 includes the side support 111 disposed on the side surface of the display panel 101 and the rear support 115 disposed on the rear surface of the display panel 101. The rear support 115 has a first slit 115a extending from the front surface to the rear surface thereof, in a position corresponding to the heat dissipation assembly 160.

As illustrated in FIGS. 2 and 3, the first slit 115a may be one or more slits provided on both sides of the bottom cover 110 in the longitudinal direction and extending along the housing 130. According to example embodiments, it will be described by way of example that two first slits 115a are provided on both sides in the longitudinal direction, respectively.

In addition, the plurality of circuit films 103 are provided on both sides of the display panel 101 to be spaced apart from each other. One portion of each of the plurality of circuit films 103 is connected to an end portion of the display panel 101, and the other portion of each of the plurality of circuit films 103 is connected to the PCB 105, such that the PCB 105 is disposed on the rear surface of the display panel 101.

In this example, the heat dissipation assembly 160 is disposed between the circuit films 103 and the bottom cover 110 to dissipate heat generated from the circuit films 103, including the driving ICs 103a mounted on the circuit films 103.

In addition, as illustrated in FIG. 3, the rear support 115 may be provided with a first stepped portion 117 protruding backward (e.g., downward in the view of FIG. 3) from a position corresponding to the heat dissipation assembly 160. The first stepped portion 117 may have the first slits 115a extending along the housing 130 in the longitudinal direction of the bottom cover 110.

The first stepped portion 117 provided as described above may reinforce the strength of the bottom cover 110, which is reduced due to the first slits 115a, while providing a space in which the heat dissipation assembly 160 may be accommodated.

As illustrated in FIG. 3, the housing 130 of the heat dissipation assembly 160 may be attached to the front surface of the rear support 115 via adhesives 104a on both sides of the first slits 115a, with the front surface thereof being spaced apart from the circuit films 103, so as to facilitate heat dissipation through the first slits 115a while protecting the circuit films 103 and the driving ICs 103a from the movement of the movable member 150.

The housing 130 may be made of a metal, such as aluminum (Al), an Al alloy, or stainless steel, or a plastic having high thermal conductivity.

In addition, the adhesives 104a may be adhesive insulating tape, adhesive thermal conductive tape, or the like, formed of a flexible material having a predetermined thickness. At least one of the adhesives 104a may be made of a thermal interface material (TIM).

The PCB 105 connected to the circuit films 103 is attached to the rear surface of the display panel 101 via the adhesives 104a, such that the position thereof is fixed. The driving ICs 103a are supported and protected by holding members 106 connected to the rear surface of the display panel 101.

In addition, the housing 130 of the heat dissipation assembly 160 has one or more communication holes 130a communicating with the first slits 115a of the bottom cover 110, such that heat generated by the circuit films 103 and the driving ICs 103a is directed to the first slits 115a of the bottom cover 110 through the top portion and the bottom portion of the housing 130.

The communication holes 130a may be provided in both, or one of, the top portion and the bottom portion of the housing 130. Although the communication holes 130a are illustrated as being provided in both the top portion and the bottom portion of the housing 130 to facilitate ambient air circulation, example embodiments of the present disclosure is not limited thereto. Example embodiments may include the housing 130 being open in at least one direction.

In addition, as illustrated in FIG. 4, an inner plate 120 may be disposed at a position spaced apart inward from one end of the display panel 101 to be attached to the rear surface of the display panel 101. The heat dissipation assembly 160 may be disposed between the inner plate 120 and the bottom cover 110.

Also, as illustrated in FIG. 4, the rear support 115 of the bottom cover 110 may be provided with second stepped portions 119 protruding backward (e.g., downward in the view of FIG. 4) from positions corresponding to the heat dissipation assembly 160. Each of the second stepped portions 119 may have a second slit 119a extending along a corresponding housing 130 in the longitudinal direction of the bottom cover 110.

The second stepped portions 119 provided as described above may reinforce the strength of the bottom cover 110, which is reduced due to the second slits 119a, while providing spaces in which heat dissipation assembly 160 is accommodated.

The inner plate 120 is coupled to the display panel 101 and the bottom cover 110 in a position spaced apart from the areas in which the circuit films 103 and the PCB 105 are provided, so as to reinforce the strength of the bottom cover 110. In this case, the housings 130 of the heat dissipation assembly 160 are attached to the rear surface of the inner plate 120 via adhesives 104a, with rear surfaces of the housings 130 being spaced apart from the second stepped portions 119.

In addition, as illustrated in FIG. 4, the second stepped portions 119 may be two or more stepped portions spaced apart from each other. A third slit 119b may be formed in another stepped portion provided between the second stepped portions 119, protruding in the opposite direction from the second stepped portions 119.

In an example where the two or more second stepped portions 119 are provided, two or more heat dissipation assemblies 160 may also be provided, as illustrated in FIG. 4. The inner plate 120 may have slits 120a formed in positions corresponding to the second stepped portions 119, and extending in the longitudinal direction of the inner plate 120.

In addition, the housing 130 of each of the heat dissipation assemblies 160 may have one or more communication holes 130a communicating with the corresponding second slit 119a. Due to this configuration, heat generated by the display panel 101 may be discharged to the second slits 119a and the third slit 119b through the slits 120a of the inner plate 120 and then through the communication holes 130a of the heat dissipation assembly 160.

In an example where the two or more heat dissipation assemblies 160 are provided as described above, the heat dissipation assemblies 160 may be configured such that the two or more housings 130-1 and 130-2 may be arranged side by side, with the side surfaces thereof adjoining each other, as illustrated in FIG. 7. In addition, conductive lines 140-1 and 140-2 and movable members 150-1 and 150-2 may be disposed within the housings 130-1 and 130-2, respectively.

With reference to FIGS. 5 to 10, each of the housings 130 of the heat dissipation assemblies 160 may include sidewalls 131 provided on peripheral portions so as to be open upwardly, and a rear wall 135 connecting the bottoms of the sidewalls 131 to form a bottom surface.

The rear wall 135 has coupling projections 133 protruding upward while being spaced apart from the sidewalls 131, such that the conductive lines 140 are fitted between the coupling projections 133 and the sidewalls 131. Holes 130b are formed in portions of the sidewalls 131, allowing the conductive lines 140 to extend therethrough to be connected to a power supply.

In addition, as described above, the one or more communication holes 130a extend through the rear wall 135 from the front surface to the rear surface thereof.

The housing 130 may further include a cover 132 fitted to and supported on the inner portions of the sidewalls 131. The cover 132 includes a lower support 134 supported by the side walls 131 and an upper support 136 bent from the lower support 134 to be parallel to the rear wall 135. Due to this configuration, the cover 132 is press-fitted into and coupled to the sidewalls 131.

One or more communication holes 130a may be formed in the upper support 136 in the same manner as in the rear wall 135. By way of example, the upper support 136 is illustrated as having a single relatively-large communication hole 130a, while the rear wall 135 is illustrated as having two or more communication holes 130a spaced apart from each other. As described above, the communication holes 130a may be provided in both, or one of, the upper support 136 and the rear wall 135.

In addition, the communication holes 130a may allow the upper portion and the lower portion of the housing 130 of the heat dissipation assembly 160 to communicate with each other, thereby facilitating the circulation of air. A single relatively-large communication hole 130a may be provided as in the case of the upper support 136, or two or more communication holes 130a may be provided as in the case of the rear wall 135. Any configuration, by which the upper portion and the lower portion of the housing 130 may communicate with each other, may be provided according to example embodiments.

The movable member 150, reciprocally movable in the longitudinal direction of the housing 130, may include a shaft 151 and one or more blades 153. The shaft 151 extends in the lateral direction of the housing 130, and is supported on the conductive lines 150. The blades 153 are inwardly distanced from both ends of the shaft 151 and protrude radially from portions of the shaft 151.

In addition, the shaft 151 is disposed between the top portions of the conductive lines 151 and the bottom portion of the lower support 134 to be supported in both upward and downward directions, such that the shaft 151 is reciprocally movable in the longitudinal direction of the housing 130.

Because the shaft 151 is made of a conductive material capable of conducting electricity, the shaft 151 may be electrically connected to the conductive lines 140, such that a current can flow through the shaft 151 and the conductive lines 140. Accordingly, the movable member 150 can move toward one end of the housing 130 or vice versa, depending on the direction in which a current flows through the conductive lines 140.

In addition, positions sensors 165 are provided on portions of the sidewalls 131 corresponding to one end portion and the other end portion of the housing 130 in order to assist a change the direction in which the movable member 150 moves. When the movable member 150 arrives at one end portion of the housing 130 in the longitudinal direction, the corresponding position sensor 165 detects the movable member 150 and transfers a detection signal to a controller (not shown), which in turn controls the direction of current flowing through the conductive lines 140 in the reverse direction, so that the movable member 150 may move toward the other end of the housing 130.

The movement of the movable member 150 will be described in more detail with reference to the example shown in FIG. 8. As illustrated in FIG. 8, the upper conductive line 140a and the lower conductive line 104b are disposed in parallel to each other. In this arrangement, current flows through the lower conductive line 140a in a direction from the left to the right, while flowing through the upper conductive line 140b in a direction from the right to the left.

In this case, a magnetic field is generated in the counterclockwise direction in the lower conductive line 140a, and a magnetic field is generated in the clockwise direction in the upper conductive line 140b, so that a resultant magnetic field B is generated in the upward direction between the two conductive lines 140a and 140b.

Accordingly, as the current flows through a conductive material 150a, electrically connected to the two conductive lines 140a and 140b, in the direction from the lower conductive line 140a to the upper conductive line 140b, rightward Lorentz force F is applied to the conductive material 150a, thereby driving conductive material 150a to the right. According to this principle, the movable member 150 according to example embodiments may move.

The blades 153 of the movable member 150 may circulate air within the housing 130 when the movable member 150 moves. As illustrated in FIGS. 9 and 10, the blades 153 radially protrude from the movable member 150.

The blades 153 may be arranged at equal distances in the circumferential direction, such that the center of mass of the movable member 150 is not shifted in any direction during the movement of the movable member 150.

As set forth above, according to example embodiments, it may be possible to improve heat dissipation performance of the display panel and the built-in components, such as the plurality of circuit films, the driving ICs, and the PCB, connected to the display panel.

In addition, according to example embodiments, the display device may be provided with a low-noise, compact heat dissipation structure without noise from a heat dissipation fan, so as to improve the image quality and durability of the display panel.

Although all of the components constituting example embodiments have been described as being combined together or as operating in concert with each other, the present disclosure is not necessarily limited thereto. One of more of components of the present disclosure may be selectively and operatively combined within the scope of the object of the present disclosure.

It will be understood that the terms "comprise," "include," "have," and any variations thereof used herein are intended to cover non-exclusive inclusions unless explicitly described to the contrary. Unless otherwise specified, all terms including technical and scientific terms used herein have the same meaning as commonly understood by a person having ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

It will be apparent to those skilled in the art that various modifications and variations can be made in the display device of the present disclosure without departing from the spirit or scope of the disclosure. Thus, it is intended that the present invention cover the modifications and variations of this disclosure provided they come within the scope of the appended claims and their equivalents.

What is claimed is:

1. A display device, comprising:
    a display panel;
    a bottom cover at a rear surface of the display panel; and
    a heat dissipation assembly including:
        a housing between the display panel and the bottom cover,
        conductive lines on two lateral sides within the housing and configured to supply electricity therethrough, and
        a movable member having both ends thereof supported by and electrically connected to the conductive lines to thereby be movable in a longitudinal direction of the housing.

2. The display device according to claim 1, wherein the bottom cover has a first slit extending from a front surface to a rear surface thereof at a position corresponding to the heat dissipation assembly.

3. The display device according to claim 2, wherein the first slit extends to both sides of the bottom cover in the longitudinal direction of the housing.

4. The display device according to claim 1, further comprising:
    a circuit film on the rear surface of the display panel,
    wherein one portion of the circuit film is connected to an end portion of the display panel, and the other portion of the circuit film is connected to a printed circuit board on the rear surface of the display panel, and
    wherein the heat dissipation assembly is between the circuit film and the bottom cover.

5. The display device according to claim 4, wherein the bottom cover further comprises:
    a first stepped portion protruding backward from a position corresponding to the heat dissipation assembly,
    the first stepped portion having a first slit extending along the housing in the longitudinal direction of the housing.

6. The display device according to claim 5, wherein the housing is attached to a front surface of the bottom cover via an adhesive, and a front surface of the housing is spaced apart from the circuit film.

7. The display device according to claim 6, wherein the housing has a communication hole aligned with the first slit.

8. The display device according to claim 1, further comprising:
    an inner plate attached to the rear surface of the display panel,
    wherein the heat dissipation assembly is between the inner plate and the bottom cover.

9. The display device according to claim 8, wherein the bottom cover further comprises:
    a second stepped portion protruding backward from a position corresponding to the heat dissipation assembly,
    the second stepped portion having a second slit extending along the housing in a longitudinal direction of the housing.

10. The display device according to claim 9, wherein the housing is attached to a rear surface of the inner plate via an adhesive, a rear surface of the housing being spaced apart from the second stepped portion.

11. The display device according to claim 9, wherein the inner plate has a slit at a position corresponding to the second stepped portion and extending in the longitudinal direction of the housing.

12. The display device according to claim 11, wherein the housing has a communication hole aligned with the second slit.

13. The display device according to claim 1, wherein the heat dissipation assembly is configured such that two or more housings are arranged side by side to adjoin each other, and the conductive lines and the movable member are within each of the housings.

14. The display device according to claim 1, wherein the housing comprises:
    sidewalls on peripheral portions of the housing and open in an upward direction; and
    a rear wall connecting bottoms of the sidewalls to provide a bottom surface,
    the rear wall including coupling projections protruding in the upward direction and spaced apart from the sidewalls,
    wherein the conductive lines are between the coupling projections and the sidewalls.

15. The display device according to claim 14, wherein the rear wall has a communication hole.

16. The display device according to claim 14, wherein the housing further comprises:
    a cover on inner portions of the sidewalls, the cover including a lower support supported by the sidewalls and an upper support bent from the lower support to be parallel to the rear wall of the housing, a communication hole being in the upper support.

17. The display device according to claim 16, wherein the movable member comprises:
    a shaft configured to extend in a lateral direction of the housing and supported on the conductive lines; and
    blades inwardly distanced from both ends of the shaft and protruding radially from the shaft.

18. The display device according to claim 17, wherein the shaft is between top portions of the conductive lines and a bottom portion of the lower support to be supported in both upward and downward directions, such that the shaft is movable in the longitudinal direction of the housing.

19. The display device according to claim 14, wherein position sensors on the sidewalls at one end portion and the other end portion of the housing, and configured to detect the movable member and transfer a signal to a controller.

20. The display device according to claim 19, wherein, when the signal is received from one of the position sensors, the controller changes a moving direction of the movable member by reversing a direction of current flowing through the conductive lines.

* * * * *